(12) United States Patent
Hoshino et al.

(10) Patent No.: US 9,160,138 B2
(45) Date of Patent: Oct. 13, 2015

(54) LIGHT-EMITTING ELEMENT ARRAY

(71) Applicant: CANON KABUSHIKI KAISHA, Tokyo (JP)

(72) Inventors: Katsuyuki Hoshino, Kawasaki (JP); Takeshi Uchida, Hiratsuka (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/552,792

(22) Filed: Nov. 25, 2014

(65) Prior Publication Data
US 2015/0146749 A1    May 28, 2015

(30) Foreign Application Priority Data
Nov. 28, 2013    (JP) .................. 2013-245897

(51) Int. Cl.
*H01S 3/04* (2006.01)
*H01S 5/024* (2006.01)
*H01S 5/183* (2006.01)

(52) U.S. Cl.
CPC ............. *H01S 5/02453* (2013.01); *H01S 5/183* (2013.01)

(58) Field of Classification Search
CPC .................. H01S 3/0405; H01S 3/04
USPC ..................................... 372/36, 34
See application file for complete search history.

(56) References Cited

U.S. PATENT DOCUMENTS
2009/0086782 A1* 4/2009 Yokoyama et al. ........ 372/49.01

FOREIGN PATENT DOCUMENTS
JP    11-150300 A    6/1999

* cited by examiner

*Primary Examiner* — Tuan Nguyen
(74) *Attorney, Agent, or Firm* — Canon USA, Inc. IP Division

(57) ABSTRACT

A light-emitting element array includes light-emitting elements that emit light in a direction perpendicular to a substrate. Each light-emitting element includes the substrate, a first nitride semiconductor layer on the substrate and having a mesa portion, an active layer made of a nitride semiconductor disposed on the surface of the mesa portion of the first semiconductor layer opposite the substrate, a second nitride semiconductor layer on the active layer, and a heat radiation layer disposed so that the surface formed by projecting the heat radiation layer on a plane perpendicular to the optical axis of the light-emitting element does not overlap with the surface formed by projecting the mesa portion on the same plane when viewed in the optical axis direction. When the light-emitting element is projected on a plane perpendicular to the optical axis, the surface has an area in a specific range.

13 Claims, 8 Drawing Sheets

LIGHT-EMITTING ELEMENT ARRAY

BACKGROUND OF THE INVENTION

1. Field of the Invention

One disclosed aspect of the embodiments relates to a light-emitting element array including a plurality of surface light-emitting elements in an array.

2. Description of the Related Art

A vertical cavity surface emitting laser (hereinafter referred to as VCSEL) is a laser that emits light in a direction perpendicular to the in-plane direction of the semiconductor substrate. The reflector used in a VCSEL is typically a distributed Bragg reflector (hereinafter referred to as DBR). The DBR generally has a multilayer structure including low-refractive-index layers and high-refractive-index layers alternately formed to an optical thickness of $\lambda/4$ each. $\lambda$ used herein represents the wavelength of light emitted from a light-emitting element. The optical thickness of a layer is represented by the product of the thickness of the layer and the refractive index of the material of the layer.

For a VCSEL using nitride semiconductor materials, it is difficult to increase the difference in refractive index between the materials, and accordingly, reflection characteristics of the semiconductor DBR are limited. Also, the materials of the layers of the DBR have a large difference in lattice constant therebetween, and crystal growth of a semiconductor DBR is difficult. In generally used VCSELs, accordingly, the lower DBR (closer to the substrate) is a semiconductor DBR, whereas the upper DBR is a dielectric DBR.

In general, the output power of semiconductor lasers is limited due to a temperature increase caused by heat generated from working elements. One of the common measures to suppress such a temperature increase is to increase the heat radiation performance of the laser.

In a VCSEL using nitride semiconductors, unfortunately, a dielectric DBR having a low thermal conductivity lies at the upper side of the element. This makes it difficult to enhance heat radiation performance. In addition, if the semiconductor DBR at the lower side is made of binary alloy semiconductor materials, such as AlN and GaN, the thermal conductivity of the semiconductor DBR can be increased, whereas the materials have a large difference in lattice constant therebetween. Such a semiconductor DBR is difficult to make. On the other hand, if the semiconductor DBR is made of ternary alloy semiconductor materials, such as AlGaN and AlInN, the production process thereof can be easier than the process using binary alloy semiconductor materials. However, the thermal conductivity of such a semiconductor DBR is low, and heat dissipation therefore decreases.

Japanese Patent Laid-Open No. 11-150300 discloses the technique of enhancing heat radiation performance by dissipating heat through a cathode disposed on an n-type nitride semiconductor layer.

High power nitride semiconductor lasers have recently been used as, for example, excitation light sources of titanium-sapphire (Ti:Sa) lasers, which are a type of solid-state laser. In this use, the excitation light source of the solid-state laser requires a high-power light source. Accordingly, the use of a VCSEL array including nitride semiconductor VCSELs in an array is effective. The optical output power of a VCSEL array is determined by multiplication of the optical output power of one VCSEL element of the VCSEL array and the number of VCSEL elements. By closely integrating VCSEL elements into a VCSEL array, high output power can be achieved.

However, if VCSEL elements are closely integrated into an array, the output power of each VCSEL element is reduced due to thermal cross-talk between the VCSEL elements, and the output power per unit area of the VCSEL array is reduced accordingly.

In the case of using a single element as in the case of the above-cited patent document, heat radiation performance can be enhanced by increasing the area of the electrode. In the case of the VCSEL array including a plurality of VCSEL elements, however, the increase of the area of the electrode leads to reduced integration in the VCSEL array and results in reduced optical power per unit area of the VCSEL array.

In order to increase the optical power per unit area of a VCSEL array produced by integrating VCSEL elements, both the heat radiation performance of each VCSEL element and the integration degree of the array must be improved.

SUMMARY OF THE INVENTION

Accordingly, the present application provides a light-emitting element array in which both the heat radiation performance of each light emitting element and the integration of the light-emitting elements in the array have been improved so that the optical output power per unit area thereof is increased.

A light-emitting element array of an embodiment includes a plurality of light-emitting elements configured to emit light in a direction perpendicular to the surface of a substrate. The light emitting elements each includes the substrate, a first nitride semiconductor layer on the substrate and having a mesa structure, an active layer made of a nitride semiconductor disposed on the surface of the mesa structure of the first semiconductor layer opposite the substrate, and a second nitride semiconductor layer on the active layer. The light-emitting element further includes a heat radiation layer so that the surface formed by projecting the heat radiation layer on a plane perpendicular to the optical axis of the light emitting element does not overlap with the surface formed by projecting the mesa structure on the same plane when viewed in the optical axis direction. When the light-emitting element is projected on a plane perpendicular to the optical axis, the surface of the projection of the heat radiation layer has an area $S_T$ satisfying the following Inequality (1), wherein $S_M$ represents the area of the surface of the projection of the mesa structure, and $S_O$ represents the area of the surface of the projection of the light-emitting region of the active layer:

$$0 < S_T \leq 390 \times (S_O/S_M)^{0.65} \qquad (1)$$

Further features of the disclosure will become apparent from the following description of exemplary embodiments with reference to the attached drawings.

BRIEF DESCRIPTION OF THE DRAWINGS

FIGS. 2A and 2B are schematic view of the structure of a model used for calculation; and FIG. 2C is the results of calculation for thermal resistance.

DESCRIPTION OF THE EMBODIMENTS

Light-emitting arrays according to exemplary embodiments of the application will now be described.

First Embodiment

The structure of a light-emitting element array (hereinafter referred to as VCSEL array) according to a first embodiment including an array of a plurality of vertical cavity surface emitting laser (VCSEL) elements will be described with reference to FIG. 1.

Figure 1:
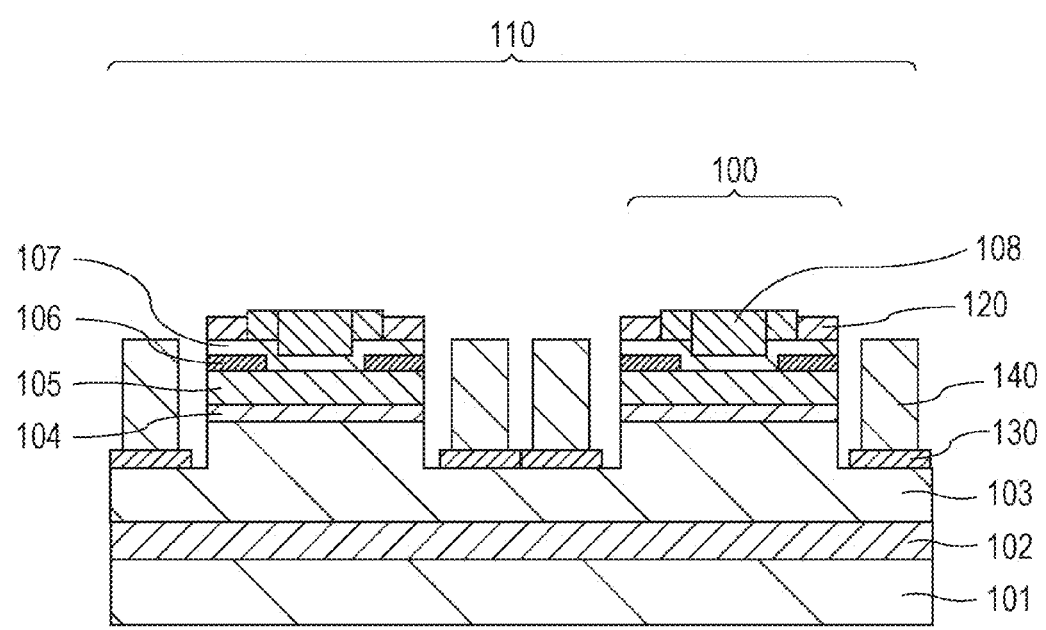
FIG. 1 is a sectional view of a VCSEL array according to a first embodiment of the application.

FIG. 1 shows a light-emitting element array (VCSEL array) 110 including light-emitting elements (VCSEL elements) 100 each having a mesa structure. FIG. 1 shows two VCSEL elements having the same structure. Each reference numeral designating a part of one of the two designates the same part of the other. The same applies to the other drawings.

In FIG. 1, reference numeral 101 designates a substrate; 102, a first reflector; 103, a first semiconductor layer; 104, an active layer; 105, a second semiconductor layer; 106, a current confinement layer; 107, a transparent electrode; 108, a second reflector; and 120, an electrode. Also, reference numeral 130 designates a heat radiation layer doubling as an electrode, and reference numeral 140 designates a heat sink. As shown in FIG. 1, the first semiconductor layer has mesa portions. The active layers 104 are disposed on the surface of the first semiconductor layer 103 opposite the substrate 101. The heat radiation layer 130 is disposed in such a manner that the surface formed by projecting the mesa portions on a plane perpendicular to the optical axis does not overlap with the surface formed by projecting the heat radiation layer on the same plane when viewed in the optical axis direction. In the present embodiment, the active layer 104 is disposed on the mesa portions or the protrusions of the first semiconductor layer 103, whereas the heat radiation layer 130 is disposed on the first semiconductor layer 103 other than the mesa portions, that is, around the protrusions.

Each light-emitting element 100 of the present embodiment produces light by injecting current to the active layer 104 using the electrode 120 and the heat radiation layer 130, thus emitting laser light in a direction perpendicular to the surface of the substrate 101. A plurality of such light emitting elements are arrayed to form a light-emitting element array.

A process for manufacturing the VCSEL element 100 will now be described.

For example, a first reflector 102 that is a semiconductor DBR including, for example, GaN layers and AlGaN layers is formed on a substrate 101 produced by growing a GaN crystal on a sapphire substrate.

Subsequently, a first semiconductor layer 103 made of, for example, n-type GaN, an active layer 104, and a second semiconductor layer 105 made of, for example, p-type GaN are formed on the first reflector 102 in that order by crystal growth.

Then, a resist is formed on the second semiconductor layer 105 for forming mesa VCSEL elements 100, and the resulting structure is dry-etched using the resist as a mask until the first semiconductor layer 103 is exposed, thus formed into a mesa structure having mesa portions.

After the resist is removed, a $SiO_2$ current confinement layer 106 having an opening in which current will be confined is formed in the uppermost layer or the second semiconductor layer 105 of each mesa portion.

Then, a transparent electrode 107 made of, for example, ITO is formed on the current confinement layer 106 and the second semiconductor layer 105 exposed in the opening of the current confinement layer 106.

Then, a second reflector 108 that may be a dielectric DBR is formed on the transparent electrode 107 so as to cover the opening in the current confinement layer 106 when viewed from a direction perpendicular to the surface of the first reflector 102.

Subsequently, an electrode 120 is formed on the surface of the transparent electrode 107 around the second reflector 108, and a heat radiation layer 130 doubling as an electrode is formed on the surface of the first semiconductor layer 103 exposed by forming the mesa portion.

Then, a heat sink 140 made of, for example, Cu is provided on the heat radiation layer 130 doubling as an electrode, and thus VCSEL elements 100 are completed. By forming the VCSEL elements 100 in an array, a VCSEL array 110 is completed.

Since p-type GaN has a higher resistance, the current applied through the electrode 120, in the present embodiment, flows only to the portion under the opening of the current confinement layer 106 and does not easily diffuse in horizontal directions. Hence, carriers are injected only to the region of the active layer 104 under the opening. This region acts as a light-emitting region.

The optical output power of the VCSEL array 110 of the present embodiment is the sum of the optical output power of each VCSEL element 100 in the array.

While closely integrating the VCSEL elements 100 is effective in increasing the optical output power per unit area of the VCSEL array 110, the closely arrayed VCSEL elements cause thermal cross-talk therebetween. This reduces the output power of each VCSEL element. Thus, the output power per unit area of the VCSEL array 110 is reduced.

Heat radiation performance can be improved by increasing the area of the heat radiation layer 130 doubling as an n-type electrode, as disclosed in the above-cited patent document.

However, the increase of the area of the heat radiation layer 130 leads to reduced integration in the VCSEL array 110 and results in reduced optical output power per unit area of the VCSEL array 110.

The present inventors have found an approach to find a combination of the area of the mesa portion, the area of the light-emitting region and the area of the heat radiation layer capable of maximizing the optical output power per unit area of the VCSEL array 110.

More specifically, the output power of the VCSEL array 110 can be maximized by determining the relationship among the area of the light-emitting region of the VCSEL element 100, the area of the mesa portion and the upper limit area of the heat radiation layer. This will be described in detail below.

A specific structure will now be described which can increase the optical output power per unit area of the VCSEL array of the present embodiment.

Thermal Resistance

In order to estimate the influence of heat generated from an independent VCSEL element, the following calculation is conducted.

Figure 2A:
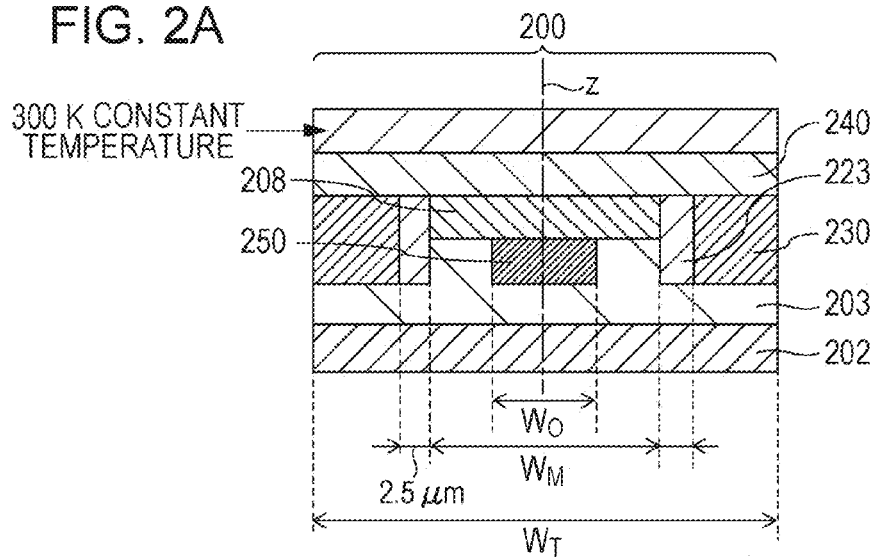
FIGS. 2A to 2C are representations of calculation for the thermal resistance of the VCSEL elements of the VCSEL array of the first embodiment.

The thermal resistance of a VCSEL element 200 shown in FIG. 2A having an exemplary structure of the embodiment is calculated.

The thermal conductivity and shape of each layer are given as below for the calculation.

The VCSEL element 200 has a mesa portion rotationally symmetrical with respect to a rotation axis z. In this VCSEL element 200, the diameters of the first reflector 202, the first semiconductor layer 203 and the heat sink 240 are each represented by $W_T$. Also, the diameters of the mesa portion of the first semiconductor layer 203 and the second reflector 208 are each represented by $W_M$. A cylindrical protective layer 223 formed along the periphery of the mesa structure has a thickness of 2.5 µm, which is the difference between the outer diameter and inner diameter of the protective layer 223. A heat source 250 has a diameter of $W_O$.

The heat radiation layer 230 is in contact with the outer periphery of the protective layer 223, and therefore has a cylindrical shape having an inner diameter of $W_M+5$ µm and an outer diameter of $W_T$.

The first reflector 202 is made of a multilayer composite having a total thickness of 4 µm, including high-refractive-index layers each made of GaN having a thermal conductivity of 130 W/(K·m) and low-refractive-index layers each made of AlGaN having a thermal conductivity of 13 W/(K·m) that are alternately overlaid and have an optical thickness of λ/4 each. The thermal conductivity of the first semiconductor layer 203 is set to the thermal conductivity of GaN, 130 W/(K·m). The portion of the first semiconductor layer 203 other than the mesa portion has a thickness of 0.6 µm, and the mesa portion of the first semiconductor layer also has a thickness of 0.6 µm. Thus the thickness of the heat source 250 is set to 0.6 µm. The thermal conductivity of the second reflector 208 is set to the thermal conductivity of the dielectric multilayer composite, 10 W(K·m), and the thermal conductivity of the protective layer 223 is set to the thermal conductivity of $SiO_2$, 5 W(K·m). The thermal conductivities of the heat radiation layer 230 and the heat sink 240 are each set to 300 W(K·m). The surface overlying the heat sink 240 has a constant temperature of 300 K. The periphery of the VCSEL element 200, that is, the region $W_T/2$ distant from the axis z, is thermally insulated.

Figure 2B:
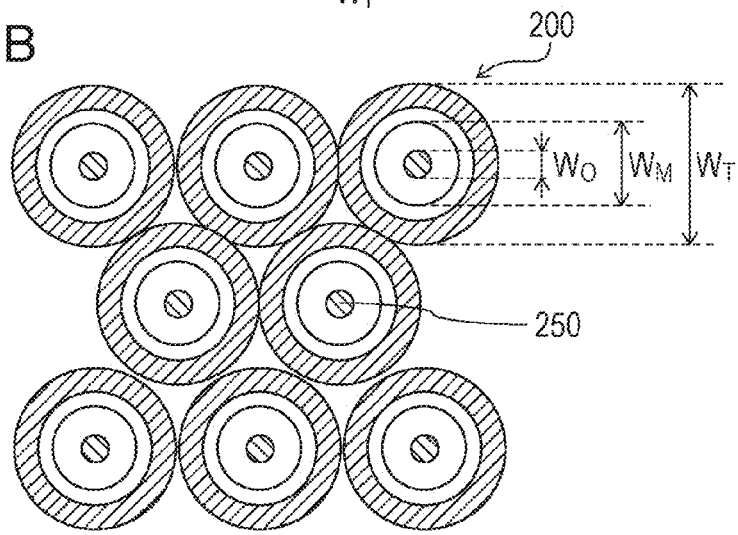
Figure 2C:
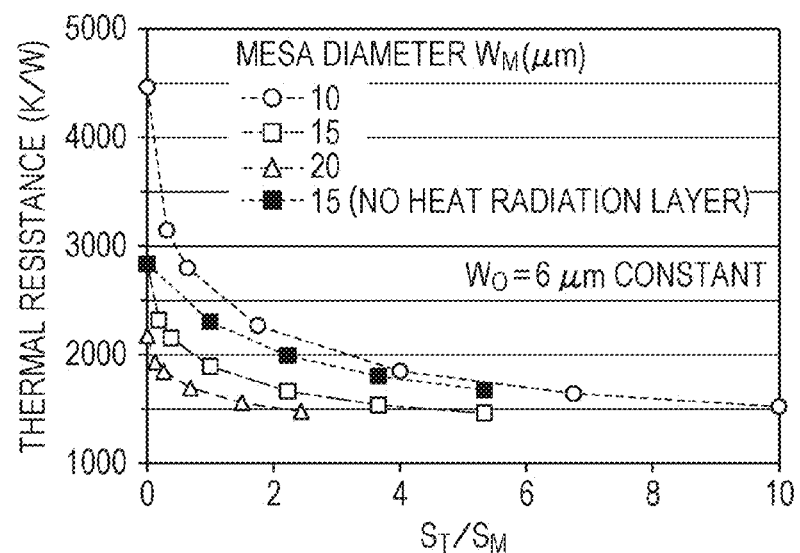

FIG. 2C shows the calculation results of thermal resistance for (area $S_T$ of heat radiation layer)/(area $S_M$ of mesa portion) in the structure shown in FIG. 2A in which the diameter $W_O$ of the heat source 250, that is, the diameter of the light emitting region limited by the current confinement structure, is given as 6 µm and the mesa diameter $W_M$ is varied to 10 µm, 15 µm, and 20 µm. In this structure, the area of the surface formed by projecting the mesa portion on a plane perpendicular to the optical axis is represented by $S_M$, and the area of the surface formed by projecting the heat radiation layer 230 on the plane is represented by $S_T$ (µm$^2$).

FIG. 2C also shows calculation results when the protective layer 223 occupies the region where the heat radiation layer 230 should lie instead of the heat radiation layer 230 in the structure with $W_M=15$ µm, that is, when the thermal conductivity of the heat radiation layer 230 is reduced to 5 W/(K·m) from 300 W/(K·m).

FIG. 2C shows that as the $S_T/S_M$ value is increased, that is, as $S_T$ is increased, thermal resistance decreases.

This is because, by increasing the area of the heat radiation layer 230, the thermally conductive heat radiation layer 230 more easily diffuses heat generated from the heat source 250 and, in addition, helps the heat radiate efficiently to the heat sink 240.

It is also shown that thermal resistance is reduced by increasing the mesa diameter $W_M$ with a constant $S_T/S_M$.

As the mesa diameter $W_M$ increases, the volume of the mesa portion increases. Accordingly, heat generated from the heat source 250 is more easily diffused.

In a structure with $W_M=15$ µm, the cases will now be compared where the heat radiation layer 230 connected to the heat sink 240 is present and where it is not.

As is clear from the results, when the heat radiation layer 230 is formed, even though the area thereof is very small, thermal resistance is reduced by about 15% in comparison with the case where the heat radiation layer 230 is not formed.

This suggests that it is effective to form the heat radiation layer 230 connected to the heat sink 240.

In addition, it has been found that even if the protective layer 223 occupies the region where the heat radiation layer 230 should be present instead of the heat radiation layer 230, thermal resistance is substantially reduced by increasing $S_T$, or $W_T$.

As $W_T$ increases, the volumes of the first semiconductor layer 203 and the first reflector 202 increase, and heat diffusion is increased by the increase of these volumes. In addition, heat diffuses slightly to the heat sink 240 through the protective layer 223.

The optical output power of the VCSEL element depends on the value of current injected to the light-emitting region, that is, the current injection region of the active layer limited by the current confinement structure.

When the current injection region of the active layer emits light by current injection, heat is generated.

Most of the heat generated in the VCSEL element is generated in the current injection region of the active layer.

If the temperature of the VCSEL element is increased by this heat, thermal saturation, which is a phenomenon in which the intensity of light emitted from the VCSEL element is saturated, occurs even if the value of current injected to the VCSEL element is increased.

Thus, the optical output power of the VCSEL element depends considerably on temperature increase in the light-emitting region.

The present inventors have found that an index called "heat dissipation per unit emission area" that is a quotient of the reciprocal of thermal resistance by the area of the light-emitting region limited by the current confinement structure is important in estimating the optical output power of an independent VCSEL element.

Figure 3:
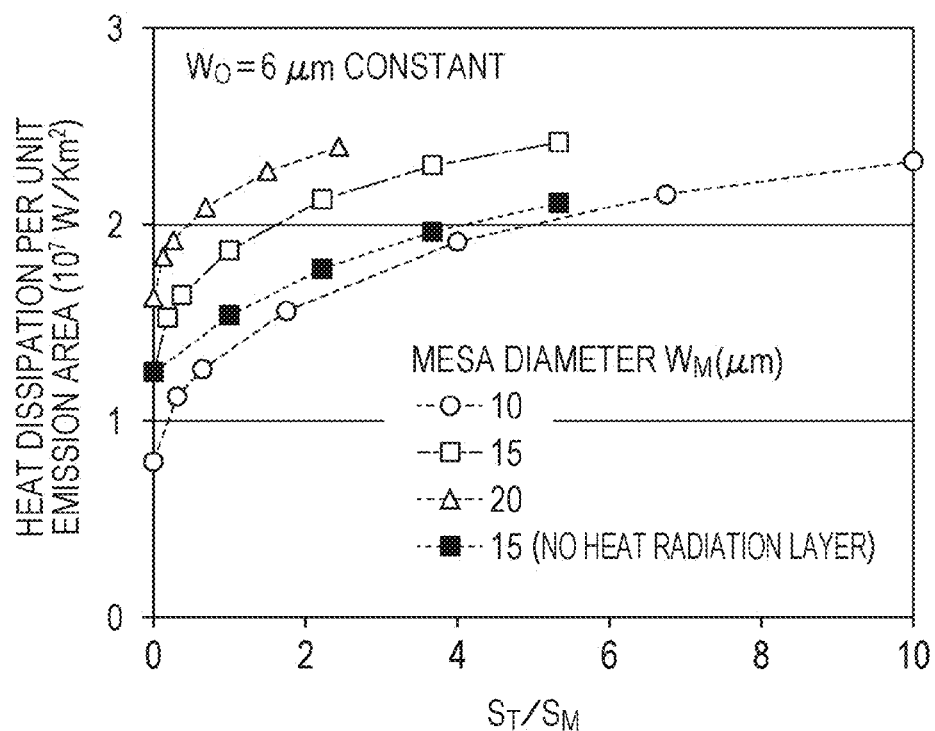
FIG. 3 is a plot of the results of calculation for the heat dissipation per unit emission area of VCSEL elements in the VCSEL array of the first embodiment.

FIG. 3 shows the results of calculation for "heat dissipation per unit emission area" obtained by dividing thermal resistance for $S_T/S_M$ by emission area $S_O$, that is, the area of the heat source having a diameter $W_O$, in a structure having a constant $W_O$ of 6 µm and $W_M$ varied to 10 µm, 15 µm or 20 µm.

As shown in FIG. 3, the heat dissipation per unit emission area can be increased by increasing $S_T$ and $W_M$.

Emission Area Ratio

In order to estimate the emission area ratio per unit area of the VCSEL array of the present embodiment, the following calculation is conducted.

The number of VCSEL elements per square millimeter and the emission area ratio per unit area of a hexagonal array, as shown in FIG. 2B, of the VCSEL elements 200 shown in FIG. 2A are calculated. The results are shown in FIG. 4.

The emission area ratio per unit area is calculated by multiplying the emission area, or the area $S_O$ of the heat source 250, and the number of VCSEL elements per square millimeter with reference to FIG. 2B and then dividing the product by 1 mm². The area $S_O$ of the heat source can be considered to be the area of the surface formed by projecting the light-emitting region of the active layer on a plane perpendicular to the optical axis. This is because the heat source 250 of the calculation model is considered to be the light-emitting region. The light-emitting region of a structure including a current confinement layer, as in the present embodiment, is the portion of the active layer under the opening defined by the current confinement layer.

Figure 4:
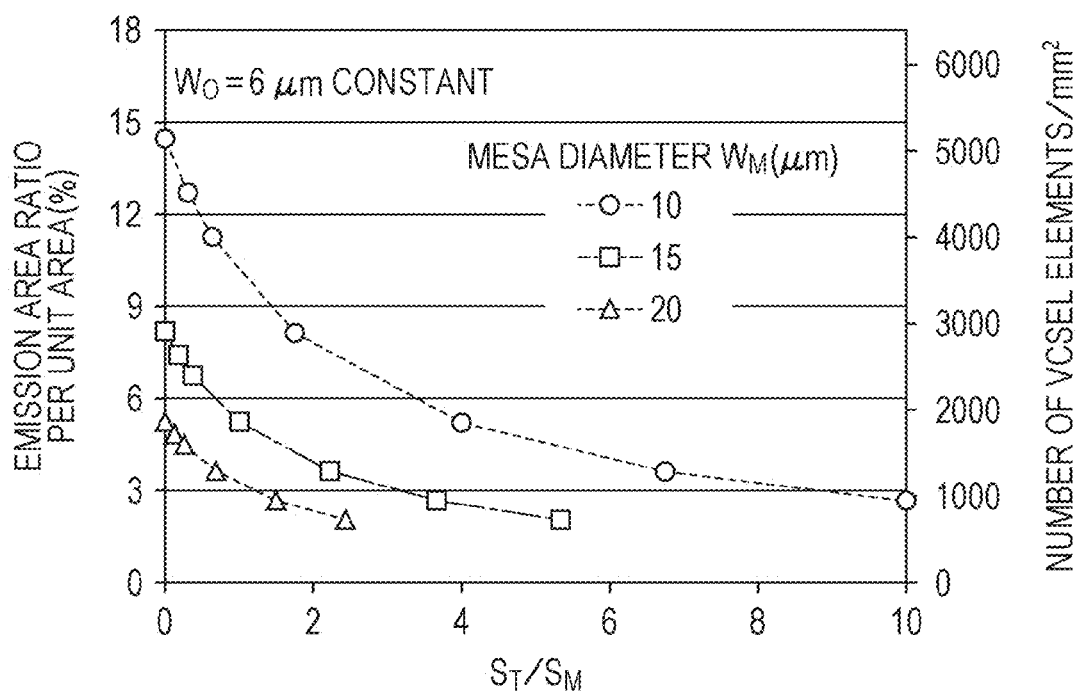
FIG. 4 is a plot of the results of calculation for the emission area ratio per unit area of the VCSEL array of the first embodiment.

As shown in FIG. 4, the number of VCSEL elements per square millimeter, that is, the integration degree of the array, is increased to increase the emission area ratio per unit area by reducing $W_M$ or $S_T$.

Thus, the optical output power per unit area of the VCSEL array is increased.

Optical Output Power Per Unit Area of VCSEL Array

As described above, it is thought that the optical output power per unit area of the VCSEL array depends on both the optical output power of an independent VCSEL element in view of thermal saturation and the integration degree of the array.

In other words, the optical output power per unit area of the VCSEL array can be considered to be proportional to the product of the heat dissipation per unit emission area and the emission area ratio per unit area.

The present inventors have found that "heat dissipation per unit emission area×emission area ratio per unit area" is useful as a comprehensive index. The use of this comprehensive index can lead to a combination of the area of the mesa portion, the area of the light-emitting region and the area of the heat radiation layer capable of maximizing the optical output power per unit area of the VCSEL array.

Figure 5:
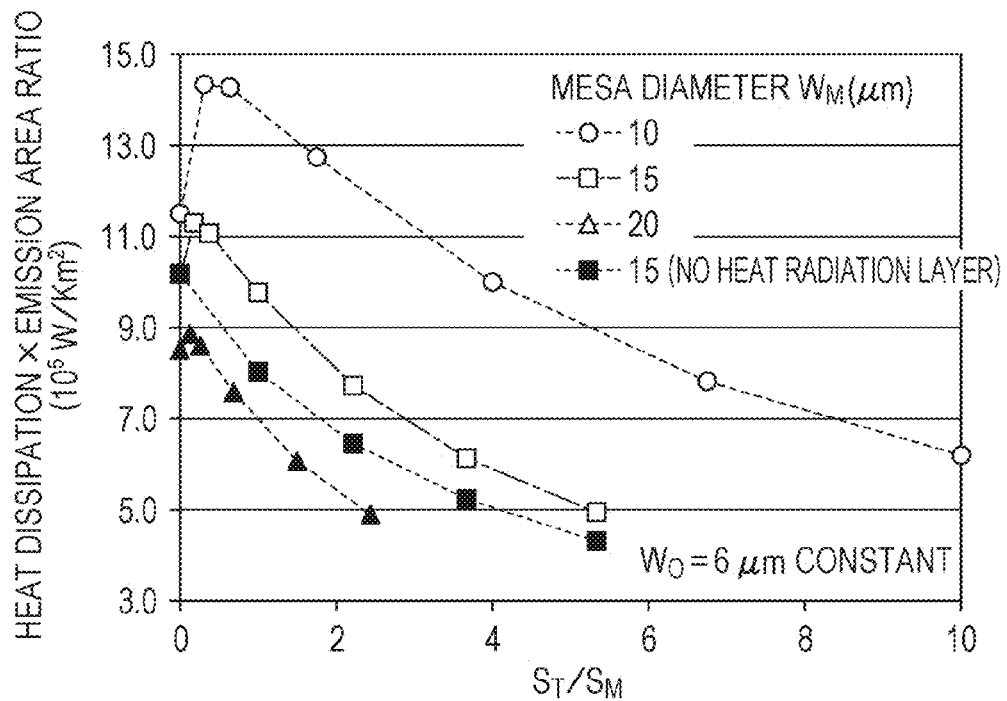
FIG. 5 is a plot of the results of calculation for "heat dissipation per unit emission area×emission area ratio per unit area" of the VCSEL array of the first embodiment.

FIG. 5 shows the calculation results of the comprehensive index, that is, the product of the heat dissipation per unit emission area shown in FIG. 3 and the emission area ratio per unit area shown in FIG. 4. In FIG. 5, "heat dissipation per unit emission area×emission area ratio per unit area" is simply expressed as "heat dissipation×emission area percentage".

FIG. 5 shows that when $S_T$ is increased in a structure of no heat radiation layer 230 and $W_M$=15 μm, the comprehensive index decreases monotonically.

On the other hand, in a structure in which the heat radiation layer 230 is present even if the area $S_T$ of the heat radiation layer 230 is small (32 μm²), the comprehensive index increases considerably by 10% or more in comparison with the case where the heat radiation layer 230 is not formed.

This is largely due to the heat dissipation increased by the presence of the heat radiation layer 230.

When $S_T$ is further increased, however, the comprehensive index stops increasing and starts decreasing.

This suggests that the optical output power per unit area of the VCSEL array is more affected by the decrease of the emission area ratio per unit area resulting from the decrease of the integration degree of the array than the increase of heat dissipation per unit emission area resulting from the increase in $S_T$. In a structure of $W_M$=15 μm and $W_O$=6 μm, when the value on the X axis in FIG. 5, or $S_T/S_M$, exceeds 0.8, that is, when $S_T$ exceeds 141 μm², the comprehensive index becomes smaller than the theoretical limit (when the value on the X axis is 0) in an array with the maximum integration degree. That is, the VCSEL array does not produce the effect of the embodiment to increase the optical output power per unit area thereof. Thus, in the structure of $W_M$=15 μm and $W_O$=6 μm, the range in which the VCSEL array can produce the effect of the embodiment is 0<$S_T$≤141 μm².

Figure 6:
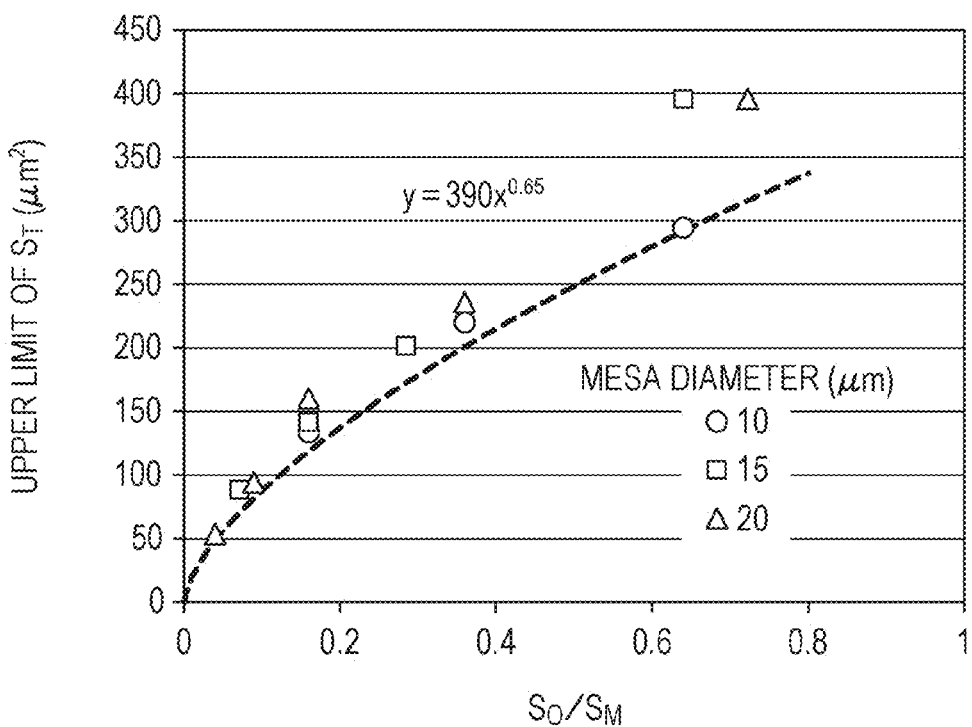
FIG. 6 is a plot of the results of calculation for the upper limit area of the heat radiation layer effective in increasing both the heat radiation performance of each VCSEL element and the integration degree of the VCSEL array.

The upper limit of $S_T$ at which the optical output power per unit area of the VCSEL array is increased is calculated in the same manner as above with $W_M$ and $W_O$ varied. The results are shown in FIG. 6. The curve indicated by the dotted line in FIG. 6 is expressed by $y=390\times x^{0.65}$.

The results suggest that by controlling the area $S_T$ (μm²) of the heat radiation layer for each VCSEL element 200 in the range of the following Inequality (1), the optical output power per unit area of the VCSEL array can be increased.

$$0<S_T\leq 390\times(S_O/S_M)^{0.65} \qquad (1)$$

In the case of a mesas diameter $W_M$ (μm) of 10, the optical output power can be increased in the range $0<S_T\leq 464\times(S_O/S_M)^{0.65}$.

Figure 7:
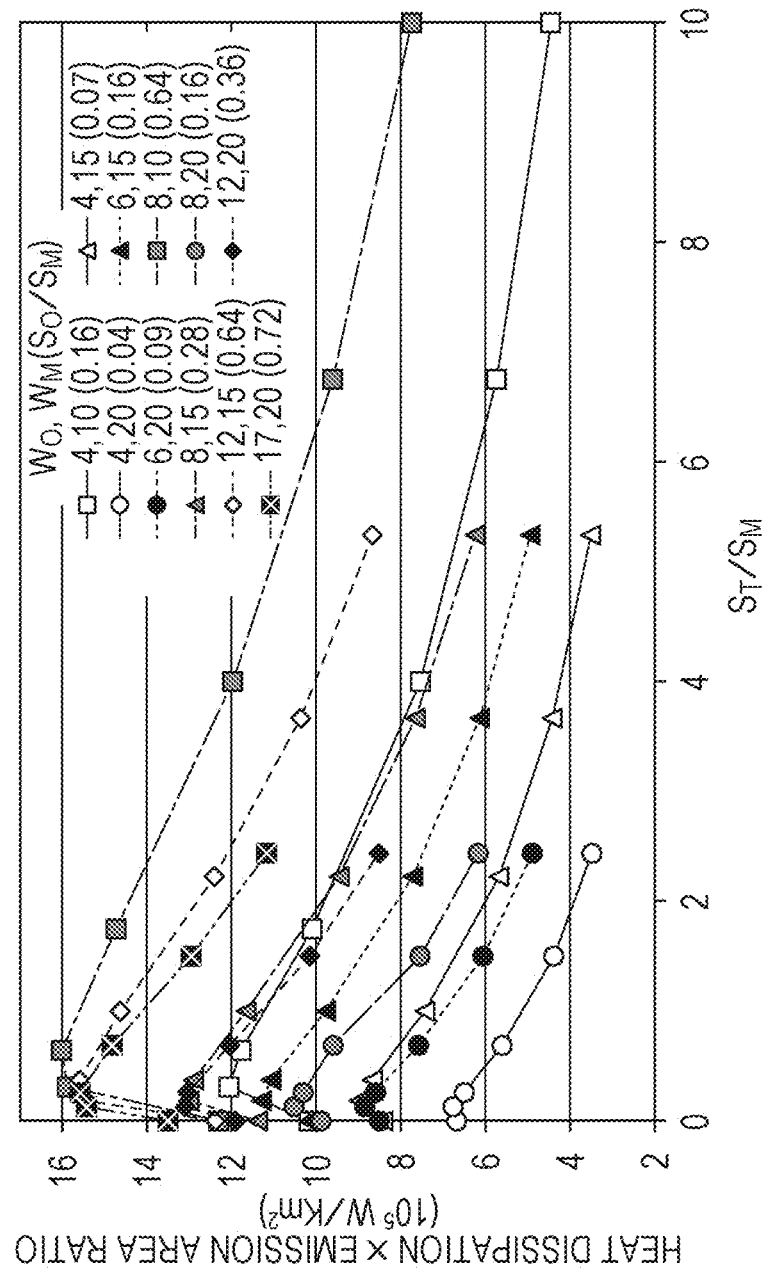
FIG. 7 is a plot of the results of calculation for "heat dissipation per unit emission area×emission area ratio per unit area" of the VCSEL array of the first embodiment.

Furthermore, the comprehensive index is calculated while varying $S_T$, $S_M$ and $S_O$. The results are shown in FIG. 7, showing that the comprehensive index is increased in the range of inequality (2):

$$0.64\leq S_O/S_M\leq 1 \qquad (2)$$

This is because the emission area ratio per unit area is increased by increasing $S_O$. In FIG. 7, "heat dissipation per unit emission area×emission area ratio per unit area" is simply expressed as heat dissipation×emission area ratio.

Furthermore, it has been found that the comprehensive index is increased in the range of inequality (3):

$$0<S_T/S_M\leq 0.64 \qquad (3)$$

The comprehensive index is calculated for a structure where $S_T$=294 μm², or $S_T/S_M$=0.64, is set for $W_O$=8 μm and $W_M$=10 μm, that is, for $S_O/S_M$=0.64.

The calculation results show that the optical output power per unit area of the VCSEL array is increased by 30% in comparison with the theoretical limit (at $S_T$=0) when the integration degree of the array is maximum.

Although the calculations in the present embodiment were conducted using a hexagonal array of the VCSEL elements 200, the arrangement of the array is not particularly limited. For example, a square array may be used for the calculations.

In the case of a square array of the VCSEL elements 200, while the emission area ratio per unit area is about 86% reduced in comparison with the case of the above-described hexagonal array, inequality (1) can be applied as the range of $S_T$ in which the optical output power per unit area of the VCSEL array can be increased.

Similarly, when inequalities (2) and (3) hold true, the output power of the VCSEL array increases.

Although the calculations in the present embodiment are conducted for the case where the heat radiation layer 230 has a thermal conductivity of 300 W/(K·m), the heat radiation layer is not limited to this.

The effect expected in the present embodiment can be produced as long as the thermal conductivity of the heat radiation layer 130 is higher than the thermal conductivities of the first semiconductor layer 103, the active layer 104 and the second semiconductor layer 105.

Accordingly, a heat radiation layer 130 made of, for example, Ag, Cu, Au or Al can be used.

In the present embodiment, the structure in which the current confinement layer 106 is disposed on the second semiconductor layer 105 has been described. The structure is however not limited to this, and the current confinement layer may be formed within the second semiconductor layer 105. In this instance, after the second semiconductor layer 105 is grown to a predetermined thickness on the active layer 104, a current confinement layer 106 having an opening in which current will be confined is formed of, for example, $SiO_2$, n-type GaN, or n-type AlGaN.

Subsequently, another layer of the second semiconductor layer 105 is formed on the current confinement layer 106 and the second semiconductor layer 105 exposed in the opening of the current confinement layer 106.

Thus, the current confinement layer 106 is formed within the second semiconductor layer 105.

In this instance, instead of forming the transparent electrode 107 on the second semiconductor layer 105, the second reflector 108 and the electrode 120 may be formed directly on the second semiconductor layer 105.

In the present embodiment, the current confinement layer 106 is desirably provided for reducing the vibration threshold of the VCSEL element 100.

It is however not limited to such a structure, and the effect expected in the present embodiment can be produced even in the case where the current confinement layer 106 is not formed.

In the present embodiment, an n-type semiconductor layer, an active layer, and a p-type semiconductor layer are formed on the first reflector 102 in that order. The formation of these layers is however not limited to that order, and the p-type semiconductor layer, the active layer and the n-type semiconductor layer may be formed in that order.

Second Embodiment

Figure 8:
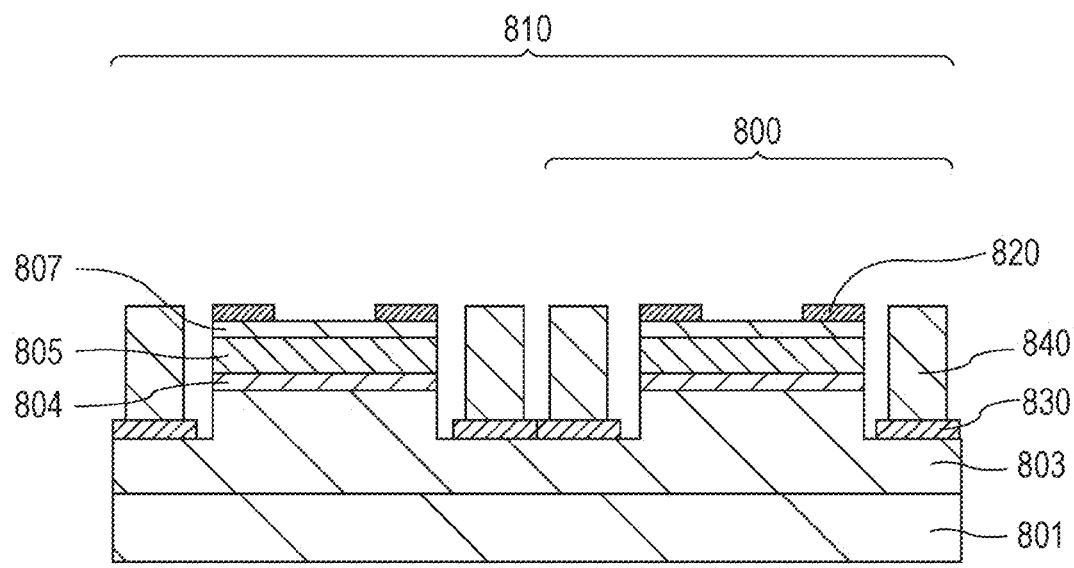
FIG. 8 is a sectional view of an LED array according to a second embodiment of the application.

A second embodiment is different from the first embodiment in that an LED array including a plurality of light-emitting diodes (LEDs) arranged in an array will be described with reference to FIG. 8. FIG. 8 shows an LED array 810 including an array of LED elements 800 defined by mesa portions.

In the drawing, reference numeral 801 designates a substrate; 803, a first semiconductor layer; 804, an active layer; 805, a second semiconductor layer; 807, a transparent electrode; 820, a semi-transparent electrode; 830, a heat radiation layer doubling as an electrode; and 840, a heat sink.

A process for manufacturing the LED element 800 will now be described.

For example, a first semiconductor layer 803 made of, for example, n-type GaN, an active layer 804, and a second semiconductor layer 805 made of, for example, p-type GaN are formed in that order on a sapphire substrate 801 on which GaN crystal has been grown.

Then, a resist is formed on the second semiconductor layer 805 for forming LED elements 800 defined by mesa portions, and the structure is dry-etched using the resist as a mask until the first semiconductor layer 803 is exposed, thus forming mesa portions.

After the resist is removed, a transparent electrode 807 of, for example, ITO is formed on each of the second semiconductor layer 805 that is the uppermost layer of the mesa portion.

Then, a semi-transparent electrode 820 is formed of, for example, Au on a part of the surface of the transparent electrode 807 to a thickness through which light from the active layer 804 can be transmitted.

Subsequently, a multilayer heat radiation layer 830 doubling as an electrode is formed on the surface of the first semiconductor layer 803 exposed by forming the mesa portions around the mesa portions.

Then, a heat sink 840 made of, for example, Cu is connected to the heat radiation layer 830 doubling as an electrode, and thus LED elements 800 are completed.

By forming the LED elements 800 in an array, an LED array 810 is formed.

In the present embodiment, as well as in the first embodiment, the combination of the area of the mesa portion, the area of the light-emitting region and the area of the heat radiation layer effective in increasing the optical output power per unit area of the LED array is expressed by Inequality (1) shown in the first embodiment.

Third Embodiment

Figure 9:
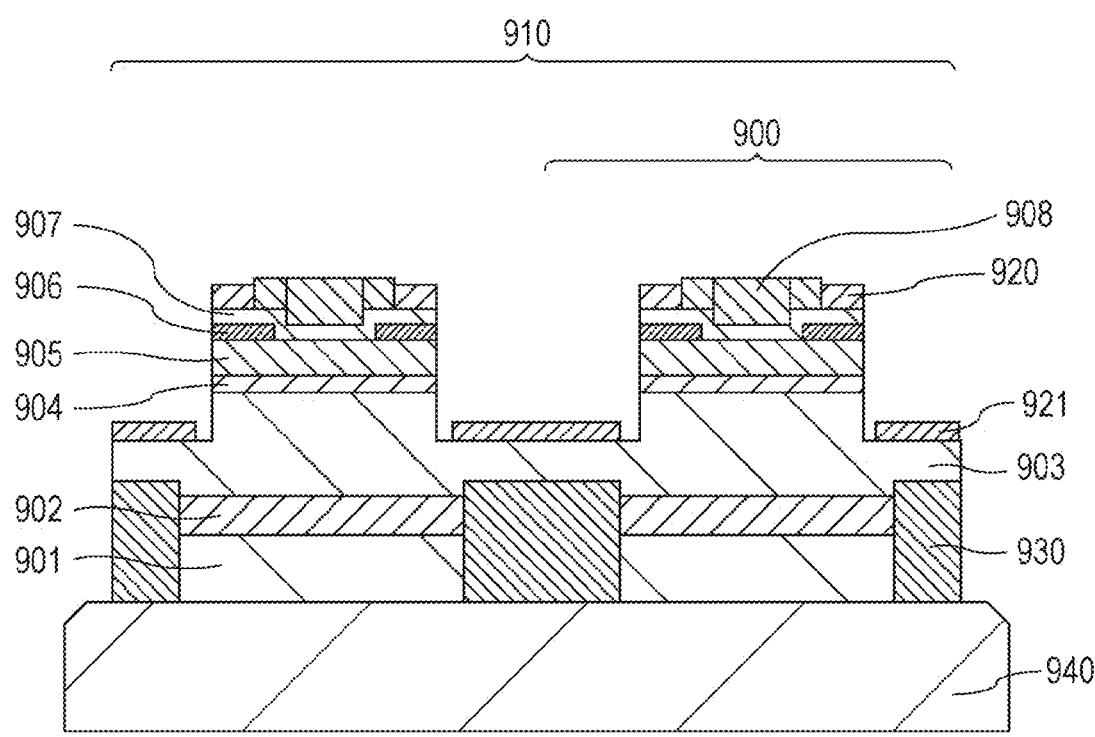
FIG. 9 is a sectional view of a VCSEL array according to a third embodiment of the application.

Unlike the first embodiment, in a third embodiment, a heat radiation layer 930 is disposed so as to come into contact with a first semiconductor layer 903 from the substrate 901, as shown in FIG. 9.

A manufacturing process of this structure will be described below.

Referring to FIG. 9, first, members up to the electrode 921 are formed in the same manner as in the first embodiment.

Subsequently, regions where the heat radiation layer 930 will be formed is formed by dry etching the rear surface of the substrate 901, that is, the surface not in contact with the first reflector 902.

More specifically, the substrate 901, the first reflector 902 and the first semiconductor layer 903 are partially removed in a ring shape when viewed in a direction perpendicular to the in-plane direction of the first reflector 902 from the rear surface of the substrate 901 until the first semiconductor layer 903 is exposed.

Subsequently, the heat radiation layer 930 layer is formed in the ring-shaped portion.

Then, a heat sing 940 is bonded in a face-up manner so as to be connected to the heat radiation layer 930, thus completing a VCSEL array 910.

Fourth Embodiment

Figure 10:
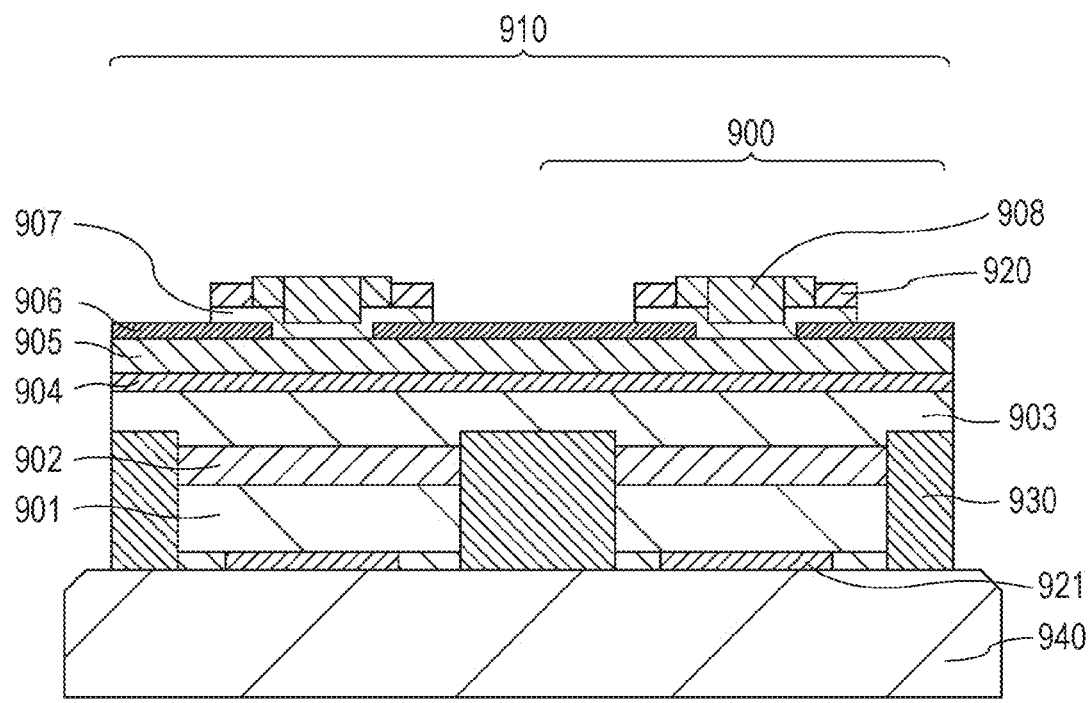
FIG. 10 is a sectional view of a VCSEL array according to a fourth embodiment of the application.

Unlike the first or third embodiment, in the fourth embodiment, one of the electrodes is formed on the rear surface of an electrically conductive substrate by forming a first reflector of conductive semiconductor DBR on the conductive substrate, as shown in FIG. 10.

A manufacturing process of this structure will be described below.

Referring to FIG. 10, first, a first reflector 902 that is a semiconductor DBR including, for example, GaN layers and AlGaN layers and doped with an n-type impurity Si is formed on an n-type GaN substrate 901 by crystal growth. Thus, the electrically conductive first reflector 902 is formed.

Subsequently, a first semiconductor layer 903 made of, for example, n-type GaN, an active layer 904, and a second semiconductor layer 905 made of, for example, p-type GaN are formed on the first reflector 902 in that order by crystal growth.

Subsequently, a SiO$_2$ current confinement layer 906 having an opening in which current will be confined is formed on the second semiconductor layer 905.

After the members up to the electrodes 920 are formed in the same manner as in the first embodiment, the heat radiation layer 930 is formed in the same manner as in the third embodiment.

Then, electrodes 921 are formed on the rear surface of the substrate 901 so as to cover the openings in the current confinement layer 906 when viewed from a direction perpendicular to the surface of the first reflector 902.

Then, a heat sink 940 is bonded in a face-up manner in the same manner as in the third embodiment so as to be connected to the heat radiation layer 930, thus completing a VCSEL array 910.

In the present embodiment, the current applied through the electrode 920 flows to the electrode 921 in a vertical direction, so that the current can be more uniformly injected to the active layer 902.

Thus, the present embodiment enables the light-emitting region of the active layer 902 to emit light more uniformly, thereby reducing the lasing threshold of the VCSEL array 910.

Also, in the present embodiment, the p-type GaN second semiconductor layer 905 has a higher resistance than the n-type GaN first semiconductor layer 903, so that current hardly diffuses to the outside of the opening of the current confinement layer 906.

Thus, this structure hardly causes cross-talk between the adjacent VCSEL elements of the VCSEL array 910; hence, the VCSEL elements need not be in mesa shapes to reduce cross-talk.

In the present embodiment, accordingly, the process steps of etching the second semiconductor layer 905 and the underlying layer until the first semiconductor layer 903 is exposed can be omitted.

The light-emitting element array of the present embodiment can be used as a solid-state laser that emits light from the light-emitting array.

Example

An example of the application will now be described. In the example, a VCSEL array will be described with reference to FIG. 11.

The VCSEL array 1110 includes a substrate 1101, first reflectors 1102, second reflectors 1108, active layers 1104, and an n-type first semiconductor layer 1103. The VCSEL array 1110 also includes p-type second semiconductor layers 1105, current confinement layers 1106, transparent electrodes 1107, electrodes 1120 and 1121, heat radiation layers 1130 and a heat sink 1140.

In the present example, the electrodes 1121 double as part of the heat radiation layers 1130.

The first reflector 1102 and each second reflector 1108 constitute a resonator of each of the VCSEL elements of the VCSEL array 1110.

The substrate 1101 is made of n-type GaN.

The first semiconductor layer 1103 and the second semiconductor layer 1105 are made of n-type and p-type GaN, respectively.

The active layer 1104 has a multi-quantum well structure using nitride semiconductor materials. The well layer and the barrier layer of the multi-quantum well structure are made of InGaN and GaN, respectively.

The band gap of the well layer is smaller than the band gaps of the barrier layer, the first semiconductor layer 1103 and the second semiconductor layer 1105.

The active layer 1104 emits light by injecting carriers. Although the active layer 1104 of the present example has a multi-quantum well structure, it may have a single quantum well structure in another example.

The silicon dioxide current confinement layer 1106 having an opening therein is disposed on the surface of each second semiconductor layer 1105. The material of the current confinement layer 1106 is not limited to silicon dioxide, and any material may be used as long as it can confine current.

Materials that can be used for the current confinement layer include n-type nitride semiconductors, and dielectric materials such as silicon nitride, zirconium oxide, tantalum oxide, niobium oxide, titanium oxide, aluminum oxide, aluminum nitride, gallium oxide, and hafnium oxide.

The transparent electrode 1107 made of ITO is disposed on the surface of the current confinement layer 1106 and the surface of the second semiconductor layer 1105 exposed in the opening of the current confinement layer 1106. The material of the transparent electrode 1107 is not limited to ITO. In another example, the transparent electrode may be made of any other material. For example, the transparent electrode may be made of ZnO.

The transparent electrodes 1107 are each provided with the electrode 1120, made of Au, on the surface thereof at least in the outer portion thereof. Also, the electrodes 1121, made of Al, capable of doubling as part of the heat radiation layers 1130 are disposed on the surface of the first semiconductor layer 1103 exposed by forming the mesa portions of the VCSEL elements.

The materials of these electrodes are not limited to Au or Al. In another example, the electrodes may be made of any other material.

Carriers injected by applying a voltage between the electrodes 1120 and 1121 are confined in the current confinement layer 1106 and enable the active layer 1104 to emit light from the region where the carriers have been injected.

The emission from the active layer 1104 resonates between the first reflector 1102 and the second reflector 1108 to amplify. Thus coherent light is surface-emitted in a direction perpendicular to the surface of the first reflector 1102.

The manufacturing process of the VCSEL array 1110 of the example will now be described.

First, the first reflector 1102 that is a nitride semiconductor DBR is formed on the n-type GaN substrate 1101 using a MOVPE (metalorganic vapor phase epitaxy) apparatus.

The first reflector 1102 is formed by alternately depositing GaN and AlGaN 60 cycles, each to an optical thickness of $\lambda/4$.

The materials of the first reflector 1102 are not limited to GaN and AlGaN. For example, InGaN and AlGaN may be used in another example without particular limitation.

Also, although the nitride semiconductor DBR (GaN and AlGaN) of the first reflector 1102 of the present example has a period of 60, any period may be set according to a desired reflectance without particular limitation.

Also, although the first reflector 1102 of the present example is made of the combination of GaN layers having optical thicknesses of $\lambda/4$ and AlGaN layers having optical thicknesses of $\lambda/4$, the structure of the first reflector may be selected according to a desired reflectance without particular limitation.

Also, although the first reflector 1102 is formed using an MOVPE apparatus in the present example, for example, an MBE (Molecular Beam Epitaxy) apparatus may be used without particular limitation.

Then, the n-type GaN first semiconductor layer 1103, the active layer 1104, and the p-type GaN second semiconductor layer 1105 are formed in that order on the first reflector 1102.

The materials of the first semiconductor layer 1103 and the second semiconductor layer 1105 are not limited to n-type GaN or p-type GaN, and may be, for example, n-type AlGaN and p-type AlGaN, respectively.

For forming VCSEL elements having a mesa structure, subsequently, a resist pattern having a pattern of circles having diameters of 10 μm in a periodic hexagonal arrangement as shown in FIG. 2B is formed on the second semiconductor layer 1105.

In this instance, the circles of the pattern are arranged at a pitch of, that is, with a period of, 17 μm so that the heat radiation layer 1130 satisfies the above inequality (1).

Subsequently, dry etching is performed using the resist pattern as a mask until the first semiconductor layer 1103 is exposed. Then, the resist pattern is removed to yield mesa portions in protruding shapes.

Although the dry etching for forming the mesa structures is performed using the resist pattern as a mask in the present example, silicon dioxide may be used for the mask.

More specifically, a silicon dioxide film is formed on the second semiconductor layer 1105, and then a resist for forming the mesa portions is formed on the silicon dioxide film.

Then, the silicon dioxide film is dry-etched using the resist as a mask to yield a silicon dioxide film for forming the mesa portions.

Subsequently, dry etching is performed using the silicon dioxide film as a mask until the first semiconductor layer 1103 is exposed. The mesa portions may be thus formed.

Then, the current confinement layer 1106 made of silicon dioxide or the like having an opening at the center thereof is formed on the second semiconductor layer 1105 defining the uppermost layer of each mesa portion.

For this purpose, first, a resist is formed on the central portions of 6 μm in diameter of the second semiconductor layers 1105 and the surface of the first semiconductor layer 1103 exposed by the above dry etching.

Then, a silicon dioxide film is formed to a thickness of 100 nm with, for example, an electron beam deposition apparatus or a sputtering apparatus.

At this time, the silicon dioxide film is formed on the periphery of the mesa portions, that is, the side surfaces of the second semiconductor layer 1105, active layer 1104 and first semiconductor layer 1103 exposed by the above dry etching.

The silicon dioxide film formed on the peripheries of the mesa portions acts as a protective film to minimize the degradation of the VCSEL elements.

The silicon dioxide film is however not limited to this form. The effect expected in the present example can be produced even if the silicon dioxide layer is not formed on the peripheries of the mesa portions.

Subsequently, the current confinement layers 1106 having circular openings satisfying Inequality (1) are formed by a lift-off process.

The shape of the opening is not limited to being circular, and may be hexagonal or tetragonal.

Also, the current confinement layer 1106 is not necessarily formed by the above process, and may be formed by, for example, dry etching.

In the case of dry etching, first, a silicon dioxide film is formed on the second semiconductor layers 1105 and the exposed surface of the first semiconductor layer 1103.

Then, a resist mask is formed on the silicon dioxide film and is subsequently patterned into a predetermined shape, followed by dry etching to form regions in which the current confinement layers 1106 and the electrodes 1121 will be formed.

The thickness of the current confinement layer 1106 is not limited to 100 nm and may be arbitrarily set as long as current can be confined.

From the viewpoint of forming the transparent electrode 1107 continuously over the current confinement layer 1106 and the second semiconductor layer 1105, the step height between the second semiconductor layer 1105 and the current confinement layer 1106 defined by the opening, that is, the thickness of the current confinement layer 1106 is desirably small. Preferably, the thickness of the current confinement layer 1106 is in the range of 10 nm to 200 nm.

Then, an ITO layer is formed to a thickness of 50 nm on the current confinement layer 1106, the second semiconductor layer 1105 exposed in the opening of the current confinement layer 1106 using, for example, an electron beam deposition apparatus or a sputtering apparatus, thus forming the transparent electrode 1107. The thickness of the transparent electrode 1107 is however not limited to 50 nm.

As the thickness of the transparent electrode 1107 is increased, the resistance of the transparent electrode 1107 decreases. Consequently, carriers are more easily injected into the opening of the current confinement layer 1106. A thicker transparent electrode 1107 is therefore more advantageous in this viewpoint.

As the thickness of the transparent electrode 1107 is increased, however, optical loss increases due to the light absorption of the transparent electrode 1107. Accordingly, the thickness of the transparent electrode 1107 is preferably in the range of 30 nm to 100 nm.

Then, the second reflector 1108 that is a dielectric DBR is formed on the transparent electrode 1107 so as to cover the opening in the current confinement layer 1106 when viewed from a direction perpendicular to the surface of the first reflector 1110.

The second reflector 1108 is formed by alternately depositing $SiO_2$ and $Ta_2O_5$ 13 cycles, each to an optical thickness of $\lambda/4$.

The second reflector 1108 may be formed in any region except the outer portions of the transparent electrodes 1107 on which the electrodes 1120 are formed, as long as the openings of the current confinement layers 1106 are covered when viewed in the direction perpendicular to the surface of the first reflector 1102.

Also, although the dielectric DBR of the second reflector 1108 of the present example has a period of 13, any period may be set according to a desired reflectance without particular limitation, as long as the DBR is formed by deposition of at least one cycle.

The materials of the dielectric DBR of the second reflector 1108 are not limited to $SiO_2$ and $Ta_2O_5$, and the dielectric DBR may be formed of other materials.

Other materials that can be used for the dielectric DBR include zirconium dioxide ($ZrO_2$), silicon nitride ($Si_xN_y$), titanium oxide ($Ti_xO_y$), $MgF_2$, $CaF_2$, $BaF_2$, $Al_2O_3$, and LiF.

Subsequently, the electrodes 1120 are formed on the surfaces of the transparent electrodes 1107 around the second reflectors 1108.

Figure 11:
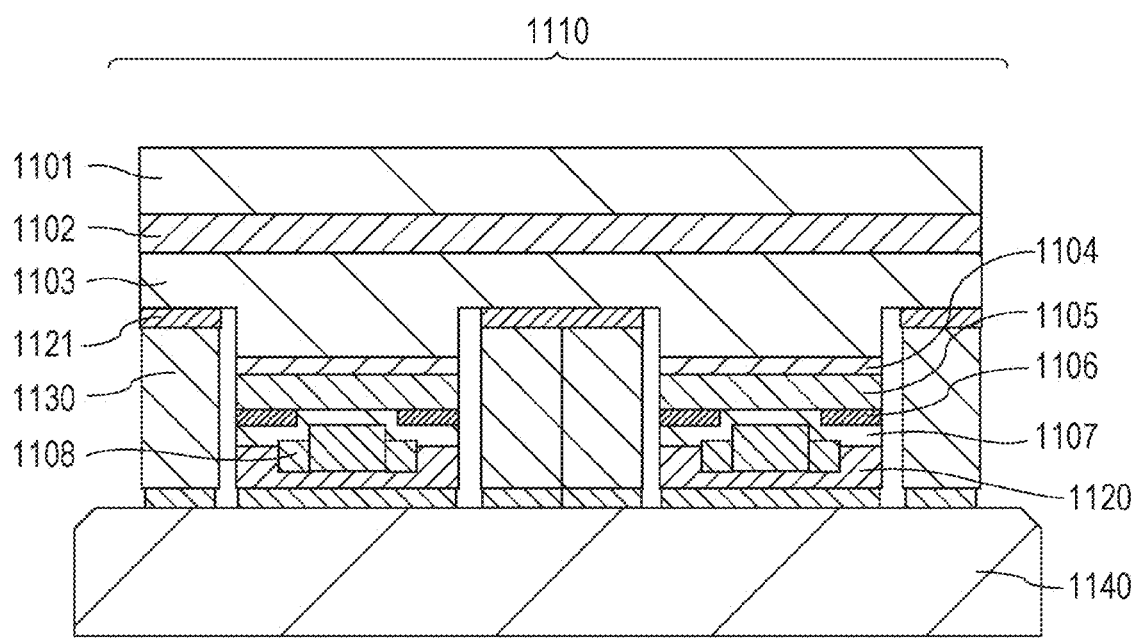
FIG. 11 is a sectional view of a VCSEL array of an example.

At this time, as shown in FIG. 11, each electrode 1120 may be continuously formed on the surface of the second reflector 1108 and the surface of the transparent electrode 1107 not provided with the second reflector 1108 thereon.

Also, the Al electrodes 1121 capable of doubling as part of the rink-shaped heat radiation layers 1130 having an inner diameter of 15 μm and an outer diameter of 17 μm are formed on the surface of the first semiconductor layer 1103 exposed by forming the mesa portions.

In the present example, each mesa portion has a diameter of 10 μm, while the electrode 1121 has an inner diameter of 15 μm with an interval of 2.5 μm from the mesa portion. This structure allows a silicon dioxide protective film to be present on the periphery of the mesa portion.

By providing such an interval between the mesa portion and the electrode 1121, the electrode 1121 is unlikely to come into contact with the periphery of the mesa portion even if the positioning of the electrode is failed, and short circuiting is thus prevented.

However, the structure of the mesa portion and the electrodes 1121 is not limited to this, and may be such that the diameter of the mesa portion and the inner and outer diameters of the electrode 1121 simply satisfy Inequality (1).

Then, the Au heat radiation layer 1130 is formed on each of the electrodes 1121, and then flip-chip bonding is performed so that the heat radiation layer 1130 and a Cu heat sink 1140 plated with for example, Au are connected. Thus the VCSEL array 1110 satisfying Inequality (1) is completed.

Although an n-type GaN substrate is used as the substrate 1101 in the present example, the substrate is not limited to this and may be a SiC substrate.

Alternatively, a sapphire substrate on which a GaN distortion buffer layer is formed by MOVPE may be used as the substrate 1101.

A Si substrate may be substituted for the sapphire substrate. In this instance, a GaN buffer layer for reducing dislocation is formed by MOVPE on the Si substrate with a distortion buffer layer therebetween. Then a GaN layer is formed on the GaN buffer layer, and the resulting structure is used as the substrate 1101.

The reflectance of the first reflector 1102, in the present example, is set lower than that of the second reflector 1108 so that the laser light from the VCSEL array 1110 is emitted through the first reflector 1102.

Although the current confinement layer 1106 is disposed on the surface of the second semiconductor layer 1105 in the present example, it is not limited to this form. For example, the current confinement layer 1106 may be disposed on the surface of the active layer 1104, or the surface of the first semiconductor layer 1103.

In this instance, for example, the current confinement layer 1106 is formed on the surface of the active layer 1104, and the second semiconductor layer 1105 is grown in the horizontal direction from the surface of the active layer 1104 exposed in the opening of the current confinement layer 1106, thus filling the current confinement layer 1106.

In the same manner, the current confinement layer 1106 may be formed within the second semiconductor layer 1105 or the first semiconductor layer 1103.

In this instance, for example, the first semiconductor layer 1103 is grown to a thickness at which the current confinement layer 1106 is formed.

Then, the current confinement layer 1106 is formed, and the first semiconductor layer 1103 is further grown in the horizontal direction from the surface of the first semiconductor layer 1103 exposed in the opening of the current confinement layer 1106, thus filling the current confinement layer 1106. Thus, the current confinement layer 1106 can lie within the second semiconductor layer 1103.

Although the transparent electrodes 1107 are used in the present example, it is not necessary when the current confinement layer 1106 is disposed on a portion other than the surface of the second semiconductor layer 1105.

More specifically, the second reflector 1108 may be formed on the surface of the second semiconductor layer 1105 so as to cover the opening of the current confinement layer 1106 when viewed in a direction perpendicular to the surface of the first reflector 1102, without using the transparent electrode 1107.

Subsequently, the electrode 1120 is formed on the surface of the second semiconductor layer 1105 around the second reflector 1108, and thus the VCSEL array 1110 may be formed.

If the current confinement layer 1106 is disposed on a portion other than the surface of the second semiconductor layer 1105, however, the length of the resonator defined by the first reflector 1102 and the second reflector 1108 is increased because the current confinement layer 1106 is filled by crystal growth.

Accordingly, if the increase of the resonator in length should be suppressed, it is desirable to form the current confinement layer 1106 on the surface of the second semiconductor layer 1105.

In the present example, an n-type semiconductor layer, an active layer, and a p-type semiconductor layer are formed in that order. The formation of these layers is however not limited to that order, and the p-type semiconductor layer, the active layer and the n-type semiconductor layer may be formed in that order.

Although the first semiconductor layer 1103 and the second semiconductor layer 1105 are each formed in a monolayer structure in the present example, these layers are not limited to this.

For example, the first semiconductor layer 1103 may be a composite of an n-type GaN layer and an n-type AlGaN layer.

Similarly, the second semiconductor layer 1105 may be a composite of a p-type GaN layer and a p-type AlGaN layer.

Also, in the present example, the diameter of the mesa portion, and the diameter of the light-emitting region of the active layer 1104 limited by the current confinement layer 1106, and the inner and outer diameters of the heat radiation layer 1130 are 10 μm, 6 μm, 15 μm and 17 μm, respectively. However, the diameters of these members are not limited to those in the example and may be arbitrarily set as long as Inequality (1) is satisfied.

For example, the diameter of the mesa portion, and the diameter of the light-emitting region of the active layer 1104, and the inner and outer diameters of the heat radiation layer 1130 may be 15 μm, 8 μm, 20 μm and 22 μm, respectively.

Figure 12:
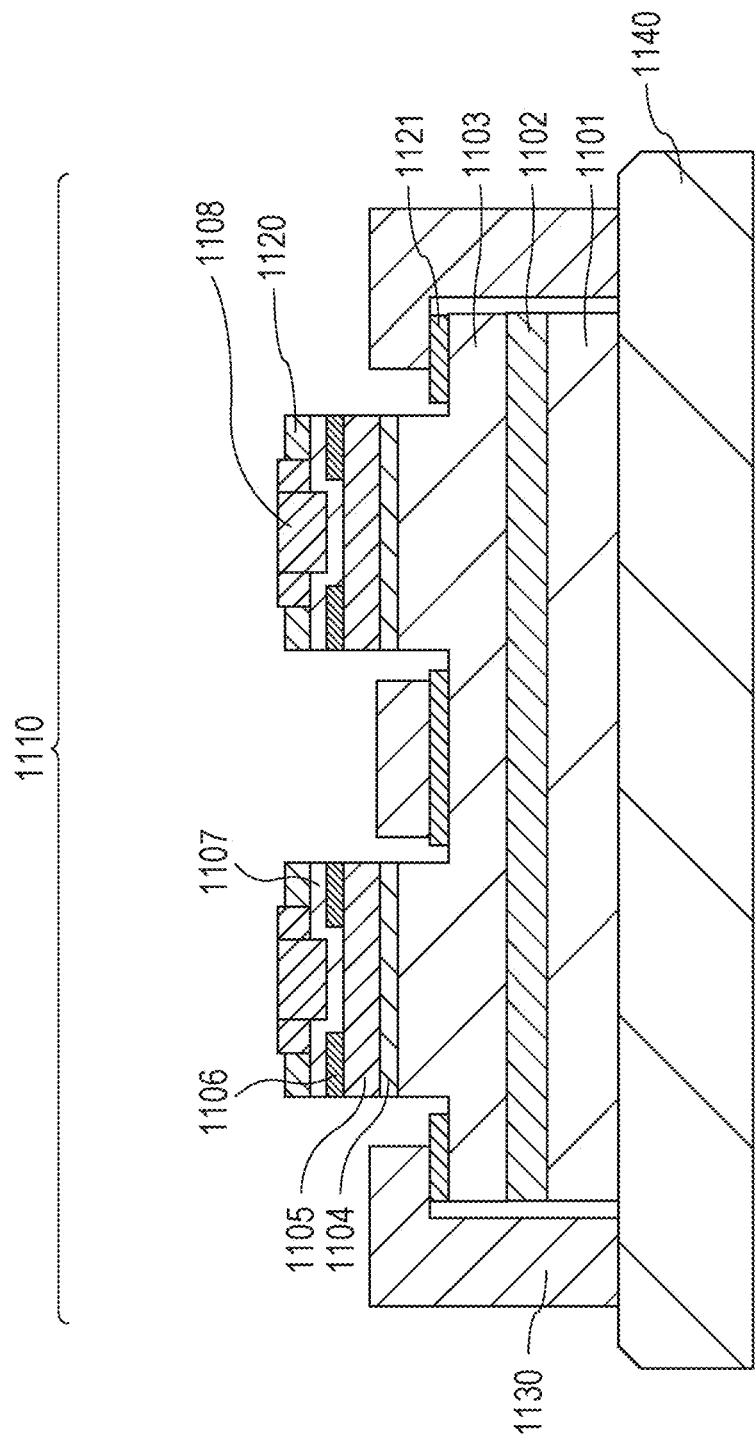
FIG. 12 is a sectional view of a VCSEL array of a modification of the example.

A modification of the present example will be described in which the VCSEL array 1110 is formed by face-up mounting, with reference to FIG. 12.

First, members up to the electrode 1121 acting as part of the heat radiation layer 1130 are formed in the same manner as in the above example.

Then, a heat sink 1140 is bonded in a face-up manner, and a heat radiation layer 1130 is formed so that the heat sink 1140 and the electrode 1121 are connected, thereby completing the VCSEL array 1110.

Unlike the above example, the VCSEL array 1110 of this modification emits laser light through the second reflector 1108. Accordingly, the reflectance of the second reflector 1108, in the modification, is set lower than that of the first reflector 1102.

In the modification, since the electrodes 1120 and 1121 are disposed at upper positions of the VCSEL array 1110, wiring via the electrodes 1120 and 1121 is easy.

Embodiments of the present application each provide a light-emitting element array in which both the heat radiation performance of each light-emitting element and the integration of the light-emitting elements in the array have been increased so that the optical output power per unit area thereof is increased.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2013-245897, filed Nov. 28, 2013, which is hereby incorporated by reference herein in its entirety.

What is claimed is:

1. A light-emitting element array comprising a plurality of light-emitting elements configured to emit light in a direction perpendicular to the surface of a substrate, each of the light-emitting elements including:
the substrate;
a first nitride semiconductor layer on the substrate, having a mesa portion;
an active layer made of a nitride semiconductor disposed on the mesa portion of the first semiconductor layer opposite the substrate, the active layer having a light-emitting region;
a second nitride semiconductor layer on the active layer; and
a heat radiation layer disposed in such a manner that the surface formed by projecting the heat radiation layer on a plane perpendicular to the optical axis of the light-emitting element does not overlap with the surface formed by projecting the mesa portion on the same plane when viewed in the optical axis direction,
wherein when the light-emitting element is projected on a plane perpendicular to the optical axis, the surface of the projection of the heat radiation layer has an area $S_T$ satisfying the inequality: $0 < S_T \leq 390 \times (S_O/S_M)^{0.65}$, and
wherein $S_M$ represents the area of the surface of the projection of the mesa portion on the plane, $S_O$ represents the area of the surface of the projection of the light-emitting region of the active layer on the plane.

2. The light-emitting element array according to claim 1, wherein the mesa portion and the light-emitting region satisfy the inequality: $0.64 \leq S_O/S_M < 1$.

3. The light-emitting element array according to claim 1, wherein the mesa portion and the heat radiation layer satisfy the inequality: $0 < S_T/S_M \leq 0.64$.

4. The light-emitting element array according to claim 1, wherein the heat radiation layer is disposed on a surface of the first semiconductor layer other than the surface of the mesa portion, opposite the substrate.

5. The light-emitting element array according to claim 1, wherein the heat radiation layer has a higher thermal conductivity than the thermal conductivities of the first semiconductor layer, the active layer and the second semiconductor layer.

6. The light-emitting element array according to claim 1, wherein the heat radiation layer functions as an electrode that injects current to the active layer.

7. The light-emitting element array according to claim 1, further comprising a heat sink on the heat radiation layer.

8. The light-emitting element array according to claim 1, wherein the mesa portion is formed in a protruding shape by removing at least the second semiconductor layer and part of the active layer to expose the first semiconductor layer.

9. The light-emitting element array according to claim 1, wherein the mesa portion is formed in a protruding shape by removing at least part of the substrate to expose the first semiconductor layer.

10. The light-emitting element array according to claim 1, wherein the light-emitting elements are surface emitting lasers.

11. The light-emitting element array according to claim 10, wherein the light-emitting elements further includes a current confinement layer defining a region of the active layer to which current is injected.

12. The light-emitting element array according to claim 1, wherein the light emitting elements are light-emitting diodes.

13. A solid-state laser comprising the light-emitting element array as set forth in claim 1.

* * * * *